(12) United States Patent
Kung et al.

(10) Patent No.: US 11,867,732 B2
(45) Date of Patent: Jan. 9, 2024

(54) OUTPUT VOLTAGE PROTECTION CONTROLLER USING VOLTAGE SIGNAL DYNAMICALLY ADJUSTED BY OFFSET VOLTAGE FOR CONTROLLING OUTPUT VOLTAGE PROTECTION OF VOLTAGE REGULATOR AND ASSOCIATED METHOD

(71) Applicant: MediaTek Singapore Pte. Ltd., Singapore (SG)

(72) Inventors: Nien-Hui Kung, San Jose, CA (US); Chia-Hua Chou, Hsinchu (TW)

(73) Assignee: MediaTek Singapore Pte. Ltd., Singapore (SG)

( * ) Notice: Subject to any disclaimer, the term of this patent is extended or adjusted under 35 U.S.C. 154(b) by 0 days.

(21) Appl. No.: 17/670,502

(22) Filed: Feb. 13, 2022

(65) Prior Publication Data

US 2022/0357373 A1    Nov. 10, 2022

Related U.S. Application Data

(60) Provisional application No. 63/222,488, filed on Jul. 16, 2021, provisional application No. 63/186,194, filed on May 10, 2021.

(51) Int. Cl.
*G01R 19/165* (2006.01)
*G01R 19/00* (2006.01)

(52) U.S. Cl.
CPC ... *G01R 19/16566* (2013.01); *G01R 19/0038* (2013.01)

(58) Field of Classification Search
CPC ......... G01R 19/16566; G01R 19/0038; H02M 1/0025; H02M 3/156; H02M 1/32
See application file for complete search history.

(56) References Cited

U.S. PATENT DOCUMENTS

| | | | |
|---|---|---|---|
| 2002/0171985 A1 | 11/2002 | Duffy | |
| 2012/0212205 A1 | 8/2012 | Yamada | |
| 2016/0241016 A1 | 8/2016 | Rana | |
| 2017/0187285 A1* | 6/2017 | Kim | ........... H02M 3/158 |
| 2020/0195139 A1 | 6/2020 | Yang | |

FOREIGN PATENT DOCUMENTS

| | | | |
|---|---|---|---|
| CN | 111082676 | * | 4/2020 |
| CN | 111082676 A | | 4/2020 |
| TW | 200630770 | | 9/2006 |
| TW | I631799 B | | 8/2018 |
| TW | I707530 B | | 10/2020 |

* cited by examiner

*Primary Examiner* — Feba Pothen
(74) *Attorney, Agent, or Firm* — Winston Hsu

(57) ABSTRACT

An output voltage protection controller includes a comparator circuit and a voltage adjustment circuit. The comparator circuit compares a first voltage signal with a second voltage signal to generate a control signal that controls output voltage protection of a voltage regulator, wherein one of the first voltage signal and the second voltage signal is a feedback voltage derived from an output voltage of the voltage regulator, and another of the first voltage signal and the second voltage signal is a voltage detection threshold. The voltage adjustment circuit injects an offset voltage to the second voltage signal for dynamically adjusting the second voltage signal during a period in which a target regulated voltage level of the output voltage is a constant.

17 Claims, 6 Drawing Sheets

OUTPUT VOLTAGE PROTECTION CONTROLLER USING VOLTAGE SIGNAL DYNAMICALLY ADJUSTED BY OFFSET VOLTAGE FOR CONTROLLING OUTPUT VOLTAGE PROTECTION OF VOLTAGE REGULATOR AND ASSOCIATED METHOD

CROSS REFERENCE TO RELATED APPLICATIONS

This application claims the benefit of U.S. Provisional Application No. 63/186,194, filed on May 10, 2021. Further, this application claims the benefit of U.S. Provisional Application No. 63/222,488, filed on Jul. 16, 2021. The contents of these applications are incorporated herein by reference.

BACKGROUND

The present invention relates to a voltage regulator design, and more particularly, to an output voltage protection controller using a voltage signal dynamically adjusted by an offset voltage for controlling output voltage protection of a voltage regulator and an associated method.

In an electronic device, a voltage regulator is used to supply stable power to electronic loads. The voltage regulator is typically designed to maintain an output voltage within specified limits even as an electrical load supported by the voltage regulator changes or as the supply power fluctuates. However, due to certain factors, the voltage regulator may fail to maintain a stable output voltage. For example, the output voltage of the voltage regulator may exceed a maximum rated voltage of the electrical load due to faults inside the voltage regulator or faults from external causes such as those in the power distribution lines. Thus, there is a need for an innovative output voltage protection design of a voltage regulator.

SUMMARY

One of the objectives of the claimed invention is to provide an output voltage protection controller using a voltage signal dynamically adjusted by an offset voltage for controlling output voltage protection of a voltage regulator and an associated method.

According to a first aspect of the present invention, an exemplary output voltage protection controller is disclosed. The exemplary output voltage protection controller includes a comparator circuit and a voltage adjustment circuit. The comparator circuit is arranged to compare a first voltage signal with a second voltage signal to generate a control signal that controls output voltage protection of a voltage regulator, wherein one of the first voltage signal and the second voltage signal is a feedback voltage derived from an output voltage of the voltage regulator, and another of the first voltage signal and the second voltage signal is a voltage detection threshold. The voltage adjustment circuit is arranged to inject an offset voltage to the second voltage signal for dynamically adjusting the second voltage signal during a period in which a target regulated voltage level of the output voltage is a constant.

According to a second aspect of the present invention, an exemplary output voltage protection controller is disclosed. The exemplary output voltage protection controller includes a comparator circuit and a voltage adjustment circuit. The comparator circuit is arranged to compare a first voltage signal with a second voltage signal to generate a control signal that controls output voltage protection of a voltage regulator, wherein one of the first voltage signal and the second voltage signal is a feedback voltage derived from an output voltage of the voltage regulator, and another of the first voltage signal and the second voltage signal is a voltage detection threshold. The voltage adjustment circuit is arranged to receive a sensing signal of an inductor current of the voltage regulator, set an offset voltage according to at least the sensing signal, and inject the offset voltage to the second voltage signal.

According to a third aspect of the present invention, an exemplary output voltage protection control method is disclosed. The exemplary output voltage protection control method includes: comparing a first voltage signal with a second voltage signal to generate a control signal that controls output voltage protection of a voltage regulator, wherein one of the first voltage signal and the second voltage signal is a feedback voltage derived from an output voltage of the voltage regulator, and another of the first voltage signal and the second voltage signal is a voltage detection threshold; and during a period in which a target regulated voltage level of the output voltage is a constant, injecting an offset voltage to the second voltage signal for dynamically adjusting the second voltage signal.

According to a fourth aspect of the present invention, an exemplary output voltage protection control method is disclosed. The exemplary output voltage protection control method includes: comparing a first voltage signal with a second voltage signal to generate a control signal that controls output voltage protection of a voltage regulator, wherein one of the first voltage signal and the second voltage signal is a feedback voltage derived from an output voltage of the voltage regulator, and another of the first voltage signal and the second voltage signal is a voltage detection threshold; receiving a sensing signal of an inductor current of the voltage regulator; setting an offset voltage according to at least the sensing signal; and injecting the offset voltage to the second voltage signal.

These and other objectives of the present invention will no doubt become obvious to those of ordinary skill in the art after reading the following detailed description of the preferred embodiment that is illustrated in the various figures and drawings.

DETAILED DESCRIPTION

Certain terms are used throughout the following description and claims, which refer to particular components. As one skilled in the art will appreciate, electronic equipment manufacturers may refer to a component by different names. This document does not intend to distinguish between components that differ in name but not in function. In the following description and in the claims, the terms "include" and "comprise" are used in an open-ended fashion, and thus should be interpreted to mean "include, but not limited to . . . ". Also, the term "couple" is intended to mean either an indirect or direct electrical connection. Accordingly, if one device is coupled to another device, that connection may be through a direct electrical connection, or through an indirect electrical connection via other devices and connections.

If a voltage detection threshold (e.g. overvoltage detection threshold or undervoltage detection threshold) is set by a constant level under a constant target regulated voltage level of an output voltage, the output voltage of a voltage regulator may suffer from unwanted overshoot or undershoot as the load of the voltage regulator suffers from load attacks and load releases. For example, a typical voltage regulator using a constant voltage detection threshold (e.g. a voltage detection threshold with fixed 840 mV that is determined by adding a fixed offset to a constant target regulated voltage level of the output voltage) may generate the output voltage with larger dynamic damping (e.g. a range from −59 mv to +200 mV). To address this issue, the present invention proposes an output voltage protection controller which employs a dynamic voltage detection threshold (e.g. dynamic overvoltage detection threshold or dynamic undervoltage detection threshold). For example, a proposed voltage regulator using a dynamic voltage detection threshold (e.g. a voltage detection threshold with a dynamic range from 768 mV to 840 mV) may generate the output voltage with smaller dynamic damping (e.g. a range from −43 mv to +101 mV). In addition, the use of the proposed dynamic voltage detection threshold (e.g. dynamic overvoltage detection threshold or dynamic undervoltage detection threshold) has no impact on the stability of the voltage regulator. Further details of the proposed output voltage protection controller in a voltage regulator will be described as below, with reference to the accompanying drawings.

Figure 1:
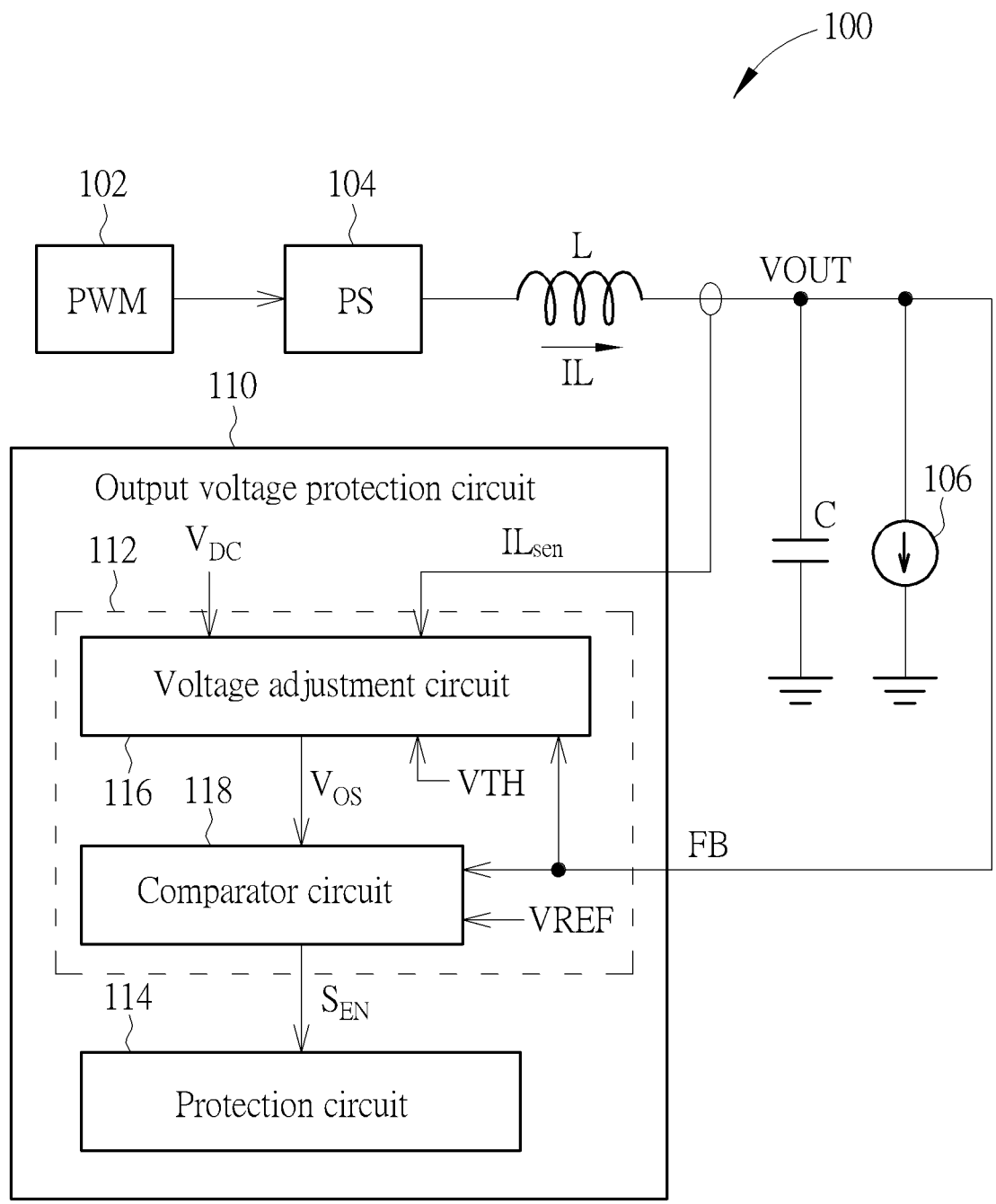
FIG. 1 is a diagram illustrating a voltage regulator according to an embodiment of the present invention.

FIG. 1 is a diagram illustrating a voltage regulator according to an embodiment of the present invention. The voltage regulator 100 may be a switching voltage regulator. As shown in FIG. 1, the voltage regulator 100 may include a pulse-width modulation controller (labeled as "PWM") 102, a power stage circuit (labeled as "PS") 104, an inductor L, and an output capacitor C. The pulse-width modulation controller 102 can regulate the output voltage VOUT delivered to the load 106 by controlling the power stage circuit 104. For example, the power stage circuit 104 may include a high-side switch and a low-side switch controlled by outputs of the pulse-width modulation controller 102. When a target regulated voltage level VREFTAR is set, the pulse-width modulation controller 102 controls the power stage circuit 104 in response to a difference between the output voltage VOUT and the target regulated voltage level VREFTAR. Hence, with the proper feedback control applied to the power stage circuit 104, a voltage level of the output voltage VOUT will approach the target regulated voltage level VREFTAR. Since a person skilled in the art can readily understand details of pulse-width modulation controller 102, power stage circuit 104, inductor L and output capacitor C, further description is omitted here for brevity.

The voltage regulator 100 further includes an output voltage protection circuit 110. In this embodiment, the output voltage protection circuit 110 includes an output voltage protection controller 112 and a protection circuit 114, where the output voltage protection controller 112 includes a voltage adjustment circuit 116 and a comparator circuit 118. It should be noted that the switching voltage regulator architecture shown in FIG. 1 is for illustrative purposes only, and is not meant to be a limitation of the present invention. In practice, any voltage regulator using output voltage protection circuit 110 (particularly, output voltage protection controller 112 of output voltage protection circuit 110) falls within the scope of the present invention.

The comparator circuit 118 is arranged to compare two voltage signals FB and VREF to generate a control signal $S_{EN}$ that controls (enables or disables) output voltage protection of the voltage regulator 100. Specifically, the protection circuit 114 is arranged to selectively enable the output voltage protection of the voltage regulator 100 according to the control signal $S_{EN}$. In some embodiments of the present invention, the output voltage protection of the voltage regulator 100 may be overvoltage protection for preventing the output voltage VOUT from being higher than an acceptable level. In some other embodiments of the present invention, the output voltage protection of the voltage regulator 100 may be undervoltage protection for preventing the output voltage VOUT from being lower than an acceptable level. The voltage signal FB is a feedback voltage derived from the output voltage VOUT of the voltage regulator 100. For example, the voltage signal FB may be equal to the output voltage VOUT of the voltage regulator 100. The voltage signal VREF is a voltage detection threshold. For example, the voltage signal VREF may be an overvoltage detection threshold or an undervoltage detection threshold.

The voltage adjustment circuit 116 is arranged to set an offset voltage $V_{OS}$ and inject the offset voltage $V_{OS}$ to one of the voltage signals FB and VREF during a period in which the target regulated voltage level VREFTAR of the output voltage VOUT is a constant. In other words, under a condition where a constant target regulated voltage level VREFTAR is set for the output voltage VOUT, an effect of dynamically adjusting a voltage detection threshold (e.g. overvoltage detection threshold or undervoltage detection threshold) can be achieved through injecting the offset voltage $V_{OS}$ to one of the voltage signals FB and VREF.

Figure 2:
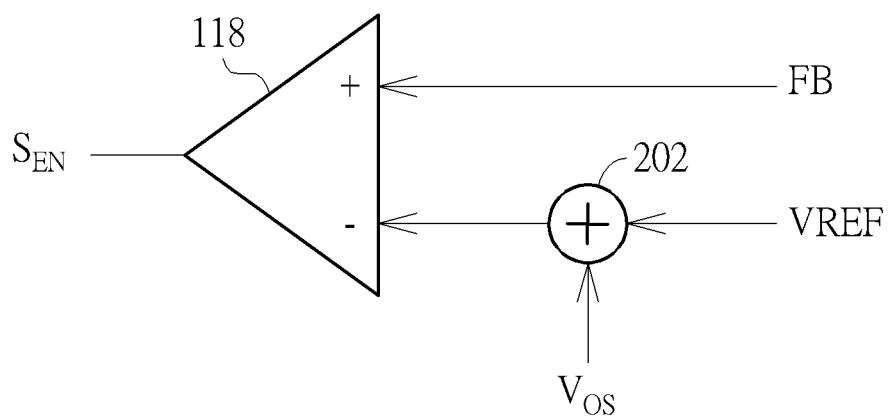
FIG. 2 is a diagram illustrating one circuit design for achieving the objective of dynamically adjusting the voltage detection threshold according to an embodiment of the present invention.

In one exemplary design, the voltage adjustment circuit 116 is arranged to inject the offset voltage $V_{OS}$ to the voltage signal VREF. FIG. 2 is a diagram illustrating one circuit design for achieving the objective of dynamically adjusting the voltage detection threshold according to an embodiment of the present invention. The voltage adjustment circuit 116 may include an adder 202 that is configured to add the offset voltage $V_{OS}$ to the voltage signal VREF (i.e. VREF=VREF+ $V_{OS}$). The voltage difference viewed from the comparator circuit 118 shown in FIG. 2 is equal to FB−(VREF+$V_{OS}$).

Figure 3:
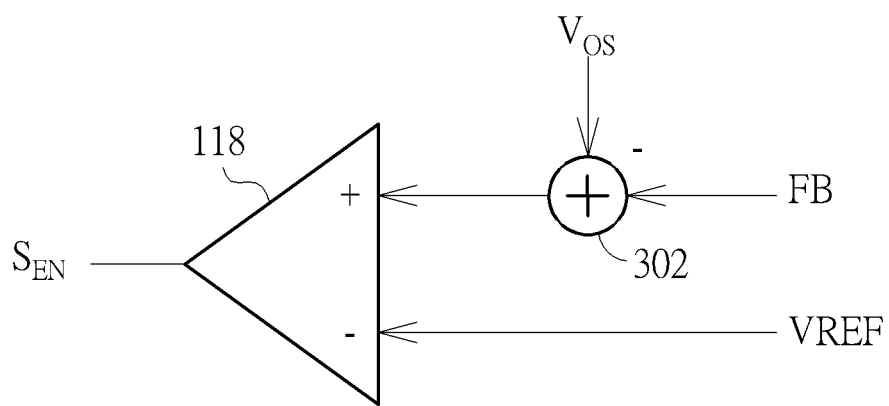
FIG. 3 is a diagram illustrating another circuit design for achieving the objective of dynamically adjusting the voltage detection threshold according to an embodiment of the present invention.

Since the comparator circuit 118 determines the control signal $S_{EN}$ by comparing the voltage signal FB with the voltage signal VREF, an effect of dynamically adjusting the voltage signal VREF is the same as that of dynamically adjusting the voltage signal FB. In another exemplary design, the voltage adjustment circuit 116 is arranged to inject the offset voltage $V_{OS}$ to the voltage signal FB. FIG. 3 is a diagram illustrating another circuit design for achieving the objective of dynamically adjusting the voltage detection threshold according to an embodiment of the present invention. The voltage adjustment circuit 116 may include a subtractor 302 that is configured to subtract the offset voltage $V_{OS}$ from the voltage signal FB (i.e. FB=FB−$V_{OS}$). The voltage difference viewed from the comparator circuit 118 shown in FIG. 3 is equal to (FB−$V_{OS}$)−VREF that is the same as the voltage difference FB−(VREF−$V_{OS}$) viewed from the comparator circuit 118 shown in FIG. 2.

As mentioned above, the voltage adjustment circuit 116 is responsible for setting the offset voltage $V_{OS}$ used to achieve dynamic adjustment of the voltage signal FB/VREF. The adjustment applied to one of the voltage signals FB and VREF may be based on a direct current (DC) level (e.g. constant voltage $V_{DC}$), or a time varying signal (e.g., sensing signal $IL_{sen}$ of an inductor current IL of the inductor L), or both of a DC level and a time varying signal, depending upon actual design considerations. Furthermore, the adjustment applied to the voltage signal FB/VREF by the offset voltage $V_{OS}$ may increase a voltage level of the voltage signal FB/VREF or decrease a voltage level of the voltage signal FB/VREF, depending upon actual design considerations.

In this embodiment, the voltage adjustment circuit 116 may be implemented by an event-aware voltage adjustment circuit. Hence, the voltage adjustment circuit 116 is further arranged to detect occurrence of an event to generate a detection result, and refer to the detection result to inject the offset voltage $V_{OS}$ to one of the voltage signals FB and VREF. For example, the voltage adjustment circuit 116 may compare the output voltage VOUT (or the voltage signal FB that is indicative of the output voltage VOUT) and an event detection threshold VTH to determine if the event occurs. For example, assuming that the protection circuit 114 is arranged to provide overvoltage protection for the voltage regulator 100, the event detection threshold VTH may be set by the target regulated voltage level VREFTAR minus a specific non-zero level, and the event to be detected is the output voltage VOUT (or the voltage signal FB that is indicative of the output voltage VOUT) being lower than the event detection threshold VTH. For another example, assuming that the protection circuit 114 is arranged to provide undervoltage protection for the voltage regulator 100, the event detection threshold VTH may be set by the target regulated voltage level VREFTAR minus a specific non-zero level, and the event to be detected is the output voltage VOUT (or the voltage signal FB that is indicative of the output voltage VOUT) being higher than the event detection threshold VTH. It should be noted that the event to be detected by the voltage adjustment circuit 116 may vary, depending upon actual design considerations.

Figure 4:
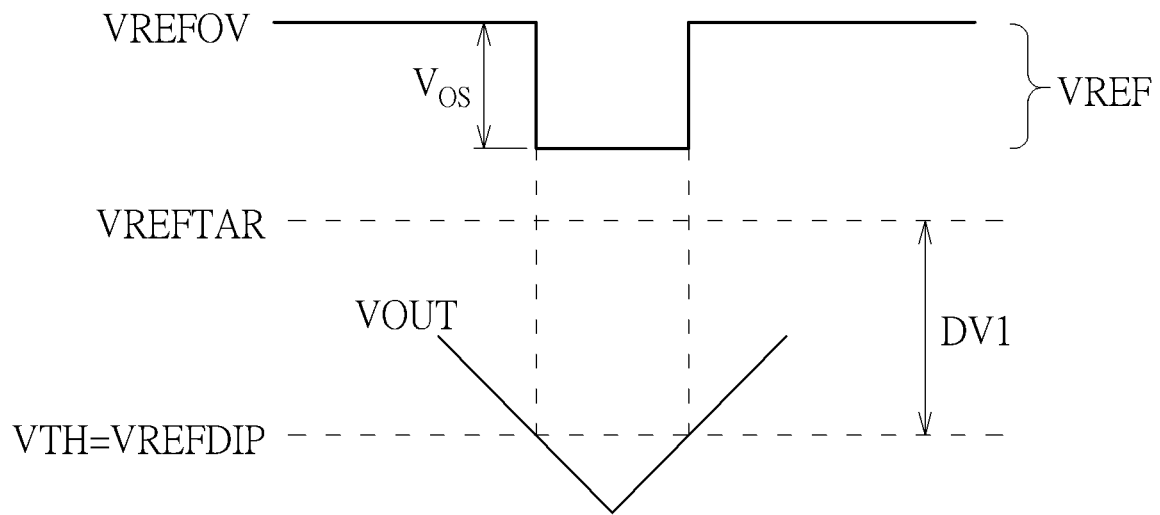
FIG. 4 is a diagram illustrating a first example of dynamically adjusting an overvoltage detection threshold used by the output voltage protection controller for controlling overvoltage protection of the voltage regulator.

FIG. 4 is a diagram illustrating a first example of dynamically adjusting an overvoltage detection threshold used by the output voltage protection controller 112 for controlling overvoltage protection of the voltage regulator 100. The voltage signal VREF is used as the overvoltage detection threshold. The event detection threshold VTH is set by an existing threshold VREFDIP used by the voltage regulator 100, where the existing threshold VREFDIP is equal to the target regulated voltage VRETAR minus a specific non-zero level DV1. An event to be detected by the voltage adjustment circuit 116 is the output voltage VOUT being lower than the event detection threshold VTH. Furthermore, the offset voltage $V_{OS}$ is set by the constant voltage $V_{DC}$, that is, adjustment applied to the overvoltage detection threshold is a DC offset. As shown in FIG. 4, the voltage signal VREF has a constant voltage VREFOV during a period in which the event does not occur, and the voltage adjustment circuit 116 injects the offset voltage $V_{OS}$ to the voltage signal VREF during a period in which the event occurs. When the output voltage VOUT is lower than VREFDIP (i.e. event occurs), the overvoltage protection threshold is adjusted to a lower level, which can prevent extra energy provided by the inductor from forcing the output voltage VOUT to jump too high. When the output voltage VOUT is higher than VREFDIP (i.e. event disappears), the overvoltage protection threshold is recovered from the lower level to a normal level VREFOV for overvoltage protection.

Figure 5:
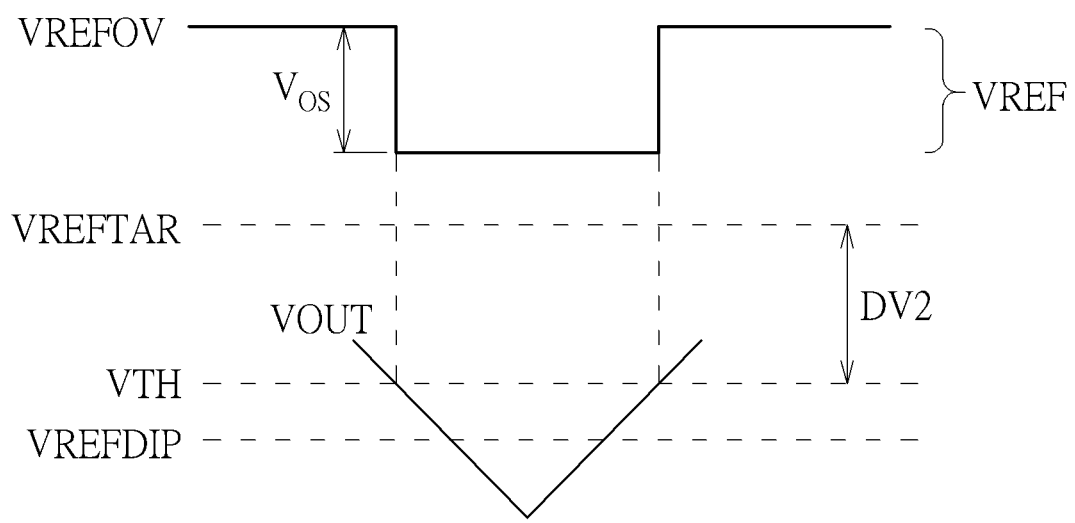
FIG. 5 is a diagram illustrating a second example of dynamically adjusting an overvoltage detection threshold used by the output voltage protection controller for controlling overvoltage protection of the voltage regulator.

FIG. 5 is a diagram illustrating a second example of dynamically adjusting an overvoltage detection threshold used by the output voltage protection controller 112 for controlling overvoltage protection of the voltage regulator 100. The voltage signal VREF is used as the overvoltage detection threshold. The event detection threshold VTH is an additional threshold not belonging to existing thresholds used by the voltage regulator 100. The event detection threshold VTH is equal to the target regulated voltage VRETAR minus a specific non-zero level DV2 (DV2≠DV1). An event to be detected by the voltage adjustment circuit 116 is the output voltage VOUT being lower than the event detection threshold VTH. Furthermore, the offset voltage $V_{OS}$ is set by the constant voltage $V_{DC}$, that is, adjustment applied to the overvoltage detection threshold is a DC offset. As shown in FIG. 5, the voltage signal VREF has the constant voltage VREFOV during a period in which the event does not occur, and the voltage adjustment circuit 116 injects the offset voltage $V_{OS}$ to the voltage signal VREF during a period in which the event occurs. When the output voltage VOUT is lower than VREFDIP (i.e. event occurs), the overvoltage protection threshold is adjusted to a lower level, which can prevent extra energy provided by the inductor L from forcing the output voltage VOUT to jump too high. When the output voltage VOUT is higher than VREFDIP (i.e. event disappears), the overvoltage protection threshold is recovered from the lower level to a normal level VREFOV for overvoltage protection.

Figure 6:
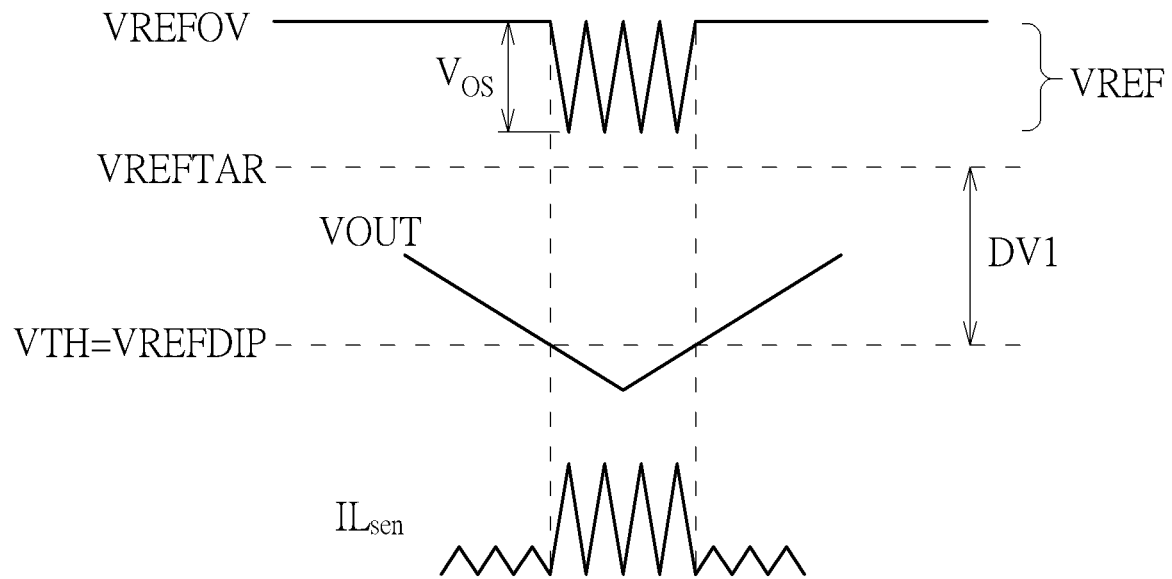
FIG. 6 is a diagram illustrating a third example of dynamically adjusting an overvoltage detection threshold used by the output voltage protection controller for controlling overvoltage protection of the voltage regulator.

FIG. 6 is a diagram illustrating a third example of dynamically adjusting an overvoltage detection threshold used by the output voltage protection controller 112 for controlling overvoltage protection of the voltage regulator 100. The voltage signal VREF is used as the overvoltage detection threshold. The event detection threshold VTH is set by an existing threshold VREFDIP used by the voltage regulator 100, where the existing threshold VREFDIP is equal to the target regulated voltage VRETAR minus a specific non-zero level DV1. An event to be detected by the voltage adjustment circuit 116 is the output voltage VOUT being lower than the event detection threshold VTH. Furthermore, the offset voltage $V_{OS}$ is set according to the sensing signal $IL_{sen}$ of the inductor current IL, that is, adjustment applied to the overvoltage detection threshold is related to the time varying inductor current IL. As shown in FIG. 6, the voltage signal VREF has a constant voltage VREFOV during a period in which the event does not occur, and the voltage adjustment circuit 116 injects the offset voltage $V_{OS}$ (which is a time varying voltage) to the voltage signal VREF during a period in which the event occurs. For example, the offset voltage $V_{OS}$ may be set by $A*(IL_{sen}-IL_{avg})$, where A is a non-zero ratio, and $IL_{avg}$ is an average value of the inductor current IL. For another example, the offset voltage $V_{OS}$ may be set by $V1-A*(IL_{sen}-IL_{avg})$, where V1 is a DC level, A is a non-zero ratio, and $IL_{avg}$ is an average value of the inductor current IL.

Figure 7:
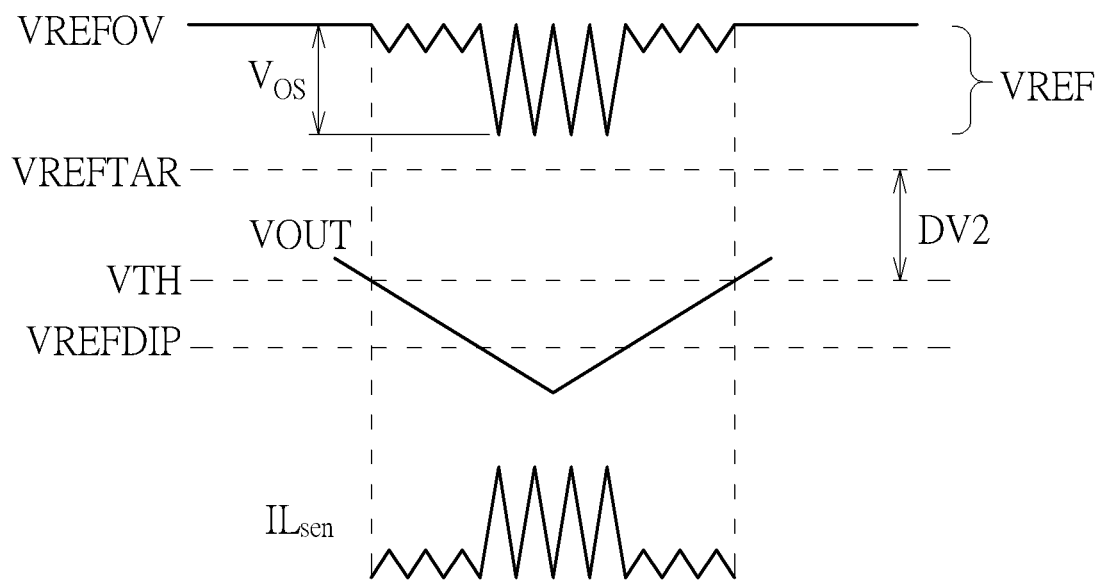
FIG. 7 is a diagram illustrating a fourth example of dynamically adjusting an overvoltage detection threshold used by the output voltage protection controller for controlling overvoltage protection of the voltage regulator.

FIG. 7 is a diagram illustrating a fourth example of dynamically adjusting an overvoltage detection threshold used by the output voltage protection controller 112 for controlling overvoltage protection of the voltage regulator 100. The voltage signal VREF is used as the overvoltage detection threshold. The event detection threshold VTH is an additional threshold not belonging to existing thresholds used by the voltage regulator 100. The event detection threshold VTH is equal to the target regulated voltage VRETAR minus a specific non-zero level DV2 (DV2≠DV1). An event to be detected by the voltage adjustment circuit 116 is the output voltage VOUT being lower than the event detection threshold VTH. Furthermore, the offset voltage $V_{OS}$ is set according to the sensing signal $IL_{sen}$ of the inductor current IL, that is, adjustment applied to the overvoltage detection threshold is related to the time varying inductor current IL. As shown in FIG. 7, the voltage signal VREF has a constant voltage VREFOV during a period in which the event does not occur, and the voltage adjustment circuit 116 injects the offset voltage $V_{OS}$ (which is a time varying voltage) to the voltage signal VREF during a period in which the event occurs. For example, the offset voltage $V_{OS}$ may be set by $A*(IL_{sen}-IL_{avg})$, where A is a non-zero ratio, and $IL_{avg}$ is an average value of the inductor current IL. For another example, the offset voltage $V_{OS}$ may be set by $V1-A*(IL_{sen}-IL_{avg})$, where V1 is a DC level, A is a non-zero ratio, and $IL_{avg}$ is an average value of the inductor current IL.

Figure 8:
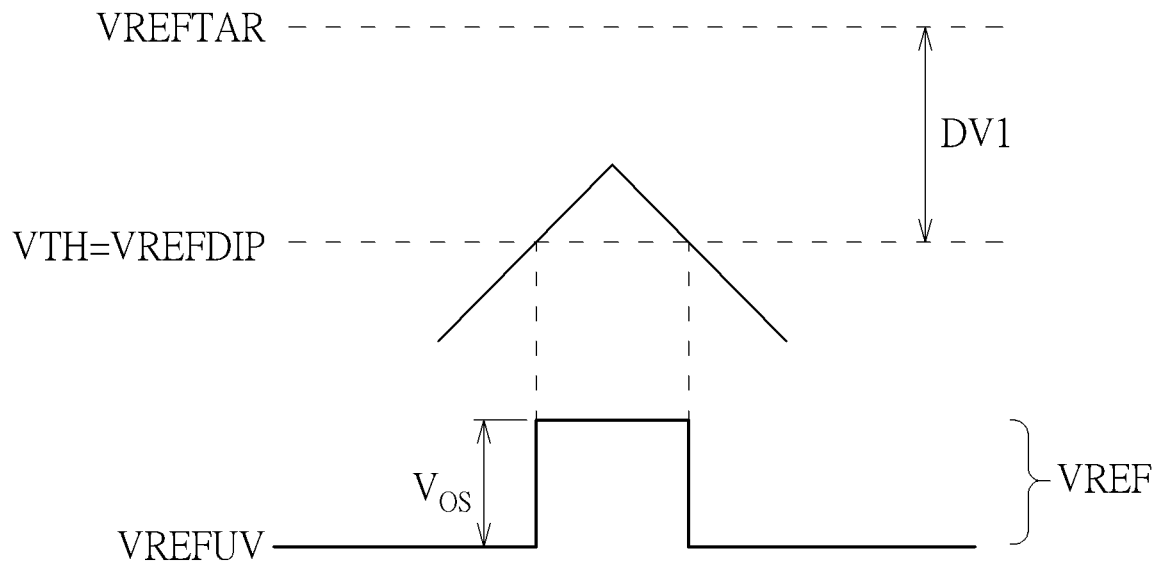
FIG. 8 is a diagram illustrating a first example of dynamically adjusting an undervoltage detection threshold used by the output voltage protection controller for controlling undervoltage protection of the voltage regulator.

The same concept of dynamically adjusting an overvoltage detection threshold used for controlling overvoltage protection can be applied to an undervoltage protection application. FIG. 8 is a diagram illustrating a first example of dynamically adjusting an undervoltage detection threshold used by the output voltage protection controller 112 for controlling undervoltage protection of the voltage regulator 100. The voltage signal VREF is used as the undervoltage detection threshold. The event detection threshold VTH is set by an existing threshold VREFDIP used by the voltage regulator 100, where the existing threshold VREFDIP is equal to the target regulated voltage VRETAR minus a specific non-zero level DV1. An event to be detected by the voltage adjustment circuit 116 is the output voltage VOUT being higher than the event detection threshold VTH. Furthermore, the offset voltage $V_{OS}$ is set by the constant voltage $V_{DC}$, that is, adjustment applied to the overvoltage detection threshold is a DC offset. As shown in FIG. 8, the voltage signal VREF has a constant voltage VREFUV during a period in which the event does not occur, and the voltage adjustment circuit 116 injects the offset voltage $V_{OS}$ to the voltage signal VREF during a period in which the event occurs.

Figure 9:
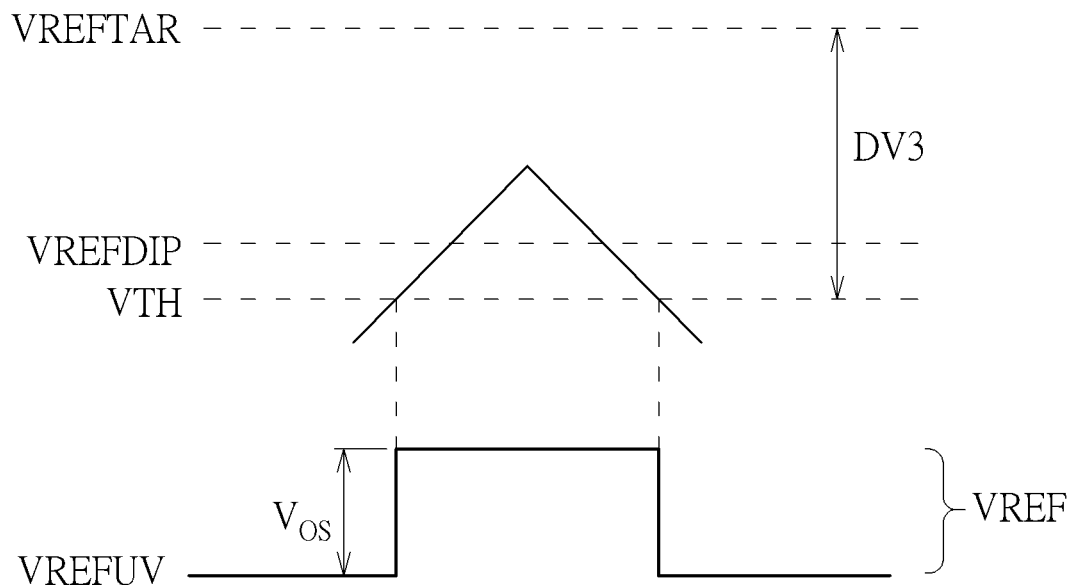
FIG. 9 is a diagram illustrating a second example of dynamically adjusting an undervoltage detection threshold used by the output voltage protection controller for controlling undervoltage protection of the voltage regulator.

FIG. 9 is a diagram illustrating a second example of dynamically adjusting an undervoltage detection threshold used by the output voltage protection controller 112 for controlling undervoltage protection of the voltage regulator 100. The voltage signal VREF is used as the undervoltage detection threshold. The event detection threshold VTH is an additional threshold not belonging to existing thresholds used by the voltage regulator 100. The event detection threshold VTH is equal to the target regulated voltage VRETAR minus a specific non-zero level DV3 (DV3≠DV1). An event to be detected by the voltage adjustment circuit 116 is the output voltage VOUT being higher than the event detection threshold VTH. Furthermore, the offset voltage $V_{OS}$ is set by the constant voltage $V_{DC}$, that is, adjustment applied to the overvoltage detection threshold is a DC offset. As shown in FIG. 9, the voltage signal VREF has the constant voltage VREFUV during a period in which the event does not occur, and the voltage adjustment circuit 116 injects the offset voltage $V_{OS}$ to the voltage signal VREF during a period in which the event occurs.

Figure 10:
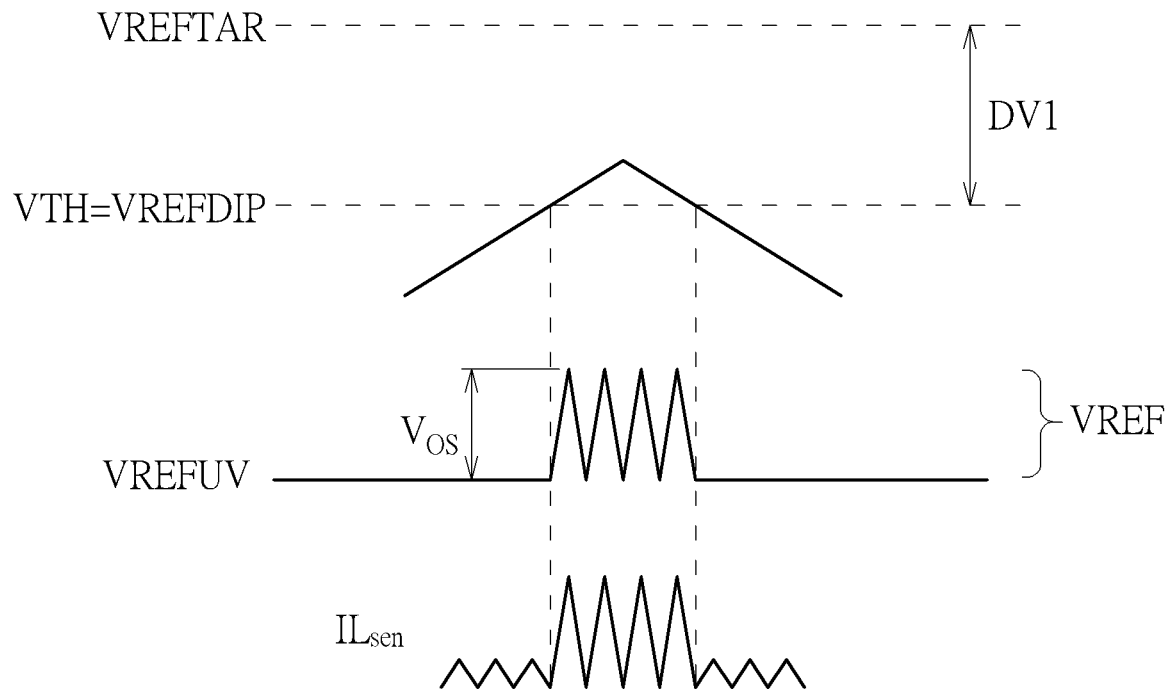
FIG. 10 is a diagram illustrating a third example of dynamically adjusting an undervoltage detection threshold used by the output voltage protection controller 112 for controlling undervoltage protection of the voltage regulator.

FIG. 10 is a diagram illustrating a third example of dynamically adjusting an undervoltage detection threshold used by the output voltage protection controller 112 for controlling undervoltage protection of the voltage regulator 100. The voltage signal VREF is used as the undervoltage detection threshold. The event detection threshold VTH is set by an existing threshold VREFDIP used by the voltage regulator 100, where the existing threshold VREFDIP is equal to the target regulated voltage VRETAR minus a specific non-zero level DV1. An event to be detected by the voltage adjustment circuit 116 is the output voltage VOUT being higher than the event detection threshold VTH. Furthermore, the offset voltage $V_{OS}$ is set according to the sensing signal $IL_{sen}$ of the inductor current IL, that is, adjustment applied to the overvoltage detection threshold is related to the time varying inductor current IL. As shown in FIG. 10, the voltage signal VREF has a constant voltage VREFUV during a period in which the event does not occur, and the voltage adjustment circuit 116 injects the offset voltage $V_{OS}$ (which is a time varying voltage) to the voltage signal VREF during a period in which the event occurs. For example, the offset voltage $V_{OS}$ may be set by $A*(IL_{sen}-IL_{avg})$, where A is a non-zero ratio, and $IL_{avg}$ is an average value of the inductor current IL. For another example, the offset voltage $V_{OS}$ may be set by $V1-A*(IL_{sen}-IL_{avg})$, where V1 is a DC level, A is a non-zero ratio, and $IL_{avg}$ is an average value of the inductor current IL.

Figure 11:
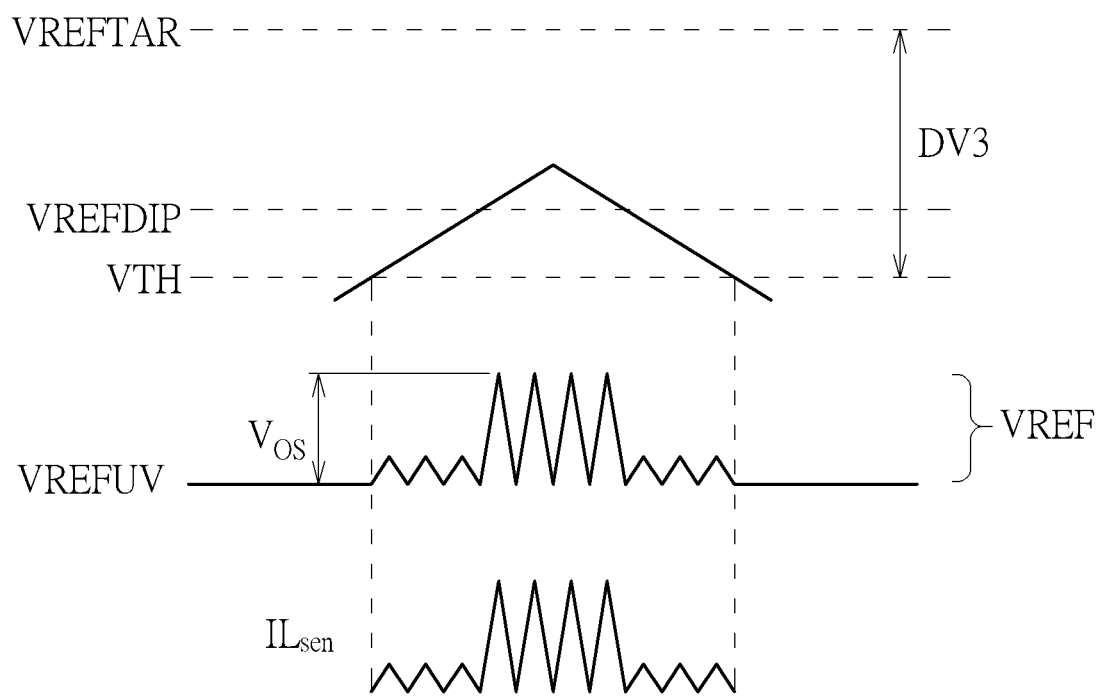
FIG. 11 is a diagram illustrating a fourth example of dynamically adjusting an undervoltage detection threshold used by the output voltage protection controller for controlling undervoltage protection of the voltage regulator.

FIG. 11 is a diagram illustrating a fourth example of dynamically adjusting an undervoltage detection threshold used by the output voltage protection controller 112 for controlling undervoltage protection of the voltage regulator 100. The voltage signal VREF is used as the undervoltage detection threshold. The event detection threshold VTH is an additional threshold not belonging to existing thresholds used by the voltage regulator 100. The event detection threshold VTH is equal to the target regulated voltage VRETAR minus a specific non-zero level DV3 (DV3≠DV1). An event to be detected by the voltage adjustment circuit 116 is the output voltage VOUT being higher than the event detection threshold VTH. Furthermore, the offset voltage $V_{OS}$ is set according to the sensing signal $IL_{sen}$ of the inductor current IL, that is, adjustment applied to the overvoltage detection threshold is related to the time varying inductor current IL. As shown in FIG. 11, the voltage signal VREF has a constant voltage VREFUV during a period in which the event does not occur, and the voltage adjustment circuit 116 injects the offset voltage $V_{OS}$ (which is a time varying voltage) to the voltage signal VREF during a period in which the event occurs. For example, the offset voltage $V_{OS}$ may be set by $A*(IL_{sen}-IL_{avg})$, where A is a non-zero ratio, and $IL_{avg}$ is an average value of the inductor current IL. For another example, the offset voltage $V_{OS}$ may be set by $V1-A*(IL_{sen}-IL_{avg})$, where V1 is a DC level, A is a non-zero ratio, and $IL_{avg}$ is an average value of the inductor current IL.

It should be noted that the offset voltages $V_{OS}$ shown in FIGS. 4-11 are for illustrative purposes only, and are not meant to be limitations of the present invention. For a first scenario, the offset voltage $V_{OS}$ may be set by an upward DC shift. For a second scenario, the offset voltage $V_{OS}$ may be set by a downward DC shift. For a third scenario, the offset voltage $V_{OS}$ may be a time varying voltage with a ramp-up waveform related to the inductor current. For a fourth scenario, the offset voltage $V_{OS}$ may be a time varying voltage with a ramp-down waveform related to the inductor current.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. An output voltage protection controller comprising:
   a comparator circuit, arranged to compare a first voltage signal with a second voltage signal to generate a control signal that controls output voltage protection of a voltage regulator, wherein one of the first voltage signal and the second voltage signal is a feedback voltage derived from an output voltage of the voltage regulator, and another of the first voltage signal and the second voltage signal is a voltage detection threshold; and
   a voltage adjustment circuit, arranged to inject an offset voltage to the second voltage signal for dynamically adjusting the second voltage signal during a period in which a target regulated voltage level of the output voltage is a constant;
   wherein the voltage adjustment circuit is arranged to detect occurrence of an event to generate a detection result, and refer to the detection result to inject the offset voltage to the second voltage signal; and the second voltage signal has a first constant voltage during a period in which the event does not occur, and the voltage adjustment circuit is arranged to set the offset voltage by a time varying voltage and inject the offset voltage to the second voltage signal during a period in which the event occurs.

2. The output voltage protection controller of claim 1, wherein said output voltage protection is overvoltage protection.

3. The output voltage protection controller of claim 1, wherein said output voltage protection is undervoltage protection.

4. The output voltage protection controller of claim 1, wherein the voltage adjustment circuit is arranged to receive a sensing signal of an inductor current of the voltage regulator, and set the time varying voltage according to at least the sensing signal.

5. The output voltage protection controller of claim 4, wherein the voltage adjustment circuit is arranged to set the time varying voltage according to the sensing signal and a second constant voltage.

6. The output voltage protection controller of claim 1, wherein the voltage adjustment circuit is arranged to detect occurrence of the event by checking if the output voltage is lower than the target regulated voltage level minus a specific non-zero level.

7. The output voltage protection controller of claim 1, wherein the voltage adjustment circuit is arranged to detect occurrence of the event by checking if the output voltage is higher than the target regulated voltage level minus a specific non-zero level.

8. An output voltage protection controller comprising:
   a comparator circuit, arranged to compare a first voltage signal with a second voltage signal to generate a control signal that controls output voltage protection of a voltage regulator, wherein one of the first voltage signal and the second voltage signal is a feedback voltage derived from an output voltage of the voltage regulator, and another of the first voltage signal and the second voltage signal is a voltage detection threshold; and
   a voltage adjustment circuit, arranged to receive a sensing signal of an inductor current of the voltage regulator, set an offset voltage according to at least the sensing signal, and inject the offset voltage to the second voltage signal, wherein the voltage adjustment circuit injects the offset voltage to the second voltage signal during a first period, and does not inject the offset voltage to the second voltage signal during a second period, where one of the first period and the second period is followed by another of the first period and the second period.

9. The output voltage protection controller of claim 8, wherein said output voltage protection is overvoltage protection.

10. The output voltage protection controller of claim 8, wherein said output voltage protection is undervoltage protection.

11. The output voltage protection controller of claim 8, wherein the voltage adjustment circuit is arranged to detect occurrence of an event to generate a detection result, and refer to the detection result to inject the offset voltage to the second voltage signal.

12. The output voltage protection controller of claim 11, wherein the second voltage signal has a first constant voltage during a period in which the event does not occur, and the voltage adjustment circuit is arranged to set the offset voltage according to at least the sensing signal and inject the offset voltage to the second voltage signal during a period in which the event occurs.

13. The output voltage protection controller of claim 12, wherein the voltage adjustment circuit is arranged to set the offset voltage according to the sensing signal and a second constant voltage.

14. The output voltage protection controller of claim 11, wherein the voltage adjustment circuit is arranged to detect occurrence of the event by checking if the output voltage is lower than the target regulated voltage level minus a specific non-zero level.

15. The output voltage protection controller of claim 11, wherein the voltage adjustment circuit is arranged to detect occurrence of the event by checking if the output voltage is higher than the target regulated voltage level minus a specific non-zero level.

16. An output voltage protection control method comprising:
   comparing a first voltage signal with a second voltage signal to generate a control signal that controls output voltage protection of a voltage regulator, wherein one of the first voltage signal and the second voltage signal is a feedback voltage derived from an output voltage of the voltage regulator, and another of the first voltage signal and the second voltage signal is a voltage detection threshold; and during a period in which a target regulated voltage level of the output voltage is a constant, injecting an offset voltage to the second voltage signal for dynamically adjusting the second voltage signal, comprising:
detecting occurrence of an event to generate a detection result; and
referring to the detection result to inject the offset voltage to the second voltage signal, wherein the second voltage signal has a first constant voltage during a period in which the event does not occur, and the offset voltage is set by a time varying voltage and is injected to the second voltage signal during a period in which the event occurs.

17. An output voltage protection control method comprising:

comparing a first voltage signal with a second voltage signal to generate a control signal that controls output voltage protection of a voltage regulator, wherein one of the first voltage signal and the second voltage signal is a feedback voltage derived from an output voltage of the voltage regulator, and another of the first voltage signal and the second voltage signal is a voltage detection threshold;

receiving a sensing signal of an inductor current of the voltage regulator;

setting an offset voltage according to at least the sensing signal; and injecting the offset voltage to the second voltage signal, wherein the offset voltage is injected to the second voltage signal during a first period, and is not injected to the second voltage signal during a second period, where one of the first period and the second period is followed by another of the first period and the second period.

* * * * *